(12) United States Patent
Kim et al.

(10) Patent No.: US 12,736,590 B2
(45) Date of Patent: Sep. 15, 2026

(54) APPARATUS AND METHOD FOR DIAGNOSING A BATTERY ASSEMBLY

(71) Applicant: LG ENERGY SOLUTION, LTD., Seoul (KR)

(72) Inventors: Min-Seok Kim, Daejeon (KR); Ju-Ri Kim, Daejeon (KR); Yoon-Jung Bae, Daejeon (KR); Hee-Seok Jeong, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 0 days.

(21) Appl. No.: 19/048,506

(22) Filed: Feb. 7, 2025

(65) Prior Publication Data

US 2025/0258244 A1 Aug. 14, 2025

(30) Foreign Application Priority Data

Feb. 8, 2024 (KR) ........................ 10-2024-0019805

(51) Int. Cl.
*G01R 31/392* (2019.01)
*G01R 31/3842* (2019.01)
(Continued)

(52) U.S. Cl.
CPC ....... *G01R 31/392* (2019.01); *G01R 31/3842* (2019.01); *G01R 31/396* (2019.01); *H02J 7/933* (2026.01)

(58) Field of Classification Search
None
See application file for complete search history.

(56) References Cited

U.S. PATENT DOCUMENTS 5,391,974 A * 2/1995 Shiojima ........... H02J 7/007194 320/155
2018/0269694 A1* 9/2018 Nam .................... G01R 31/396
(Continued)

FOREIGN PATENT DOCUMENTS

CN 205489623 U * 8/2016
CN 111766524 B 3/2023
(Continued)

OTHER PUBLICATIONS

CN 205489623 U translation (Year: 2016).*
(Continued)

*Primary Examiner* — Shelby A Turner
*Assistant Examiner* — Brandon J Becker
(74) *Attorney, Agent, or Firm* — BRYAN CAVE LEIGHTON PAISNER LLP

(57) ABSTRACT

A method for diagnosing a battery assembly according to one aspect of the present disclosure diagnoses a battery assembly including a battery bank comprising a plurality of battery cells connected in parallel with each other, and the method includes generating a differential profile representing a relationship between a differential capacity, which is obtained by differentiating a capacity of the battery bank with respect to a voltage of the battery bank, and the voltage of the battery bank; and diagnosing a state of the battery bank based on a difference value between a differential capacity value of a target peak located in a predetermined voltage section among a plurality of peaks of the differential profile and a differential capacity value of a valley adjacent to the target peak.

15 Claims, 10 Drawing Sheets

(51) Int. Cl.
*G01R 31/396* (2019.01)
*H02J 7/90* (2026.01)

(56) References Cited

U.S. PATENT DOCUMENTS

| | | | | |
|---|---|---|---|---|
| 2022/0075000 | A1* | 3/2022 | Cha | G01R 31/392 |
| 2022/0158468 | A1 | 5/2022 | Cha et al. | |
| 2022/0252676 | A1 | 8/2022 | Choi et al. | |
| 2022/0390521 | A1 | 12/2022 | Km et al. | |
| 2022/0397613 | A1* | 12/2022 | Jee | G01R 31/392 |
| 2022/0399739 | A1* | 12/2022 | Park | H01M 10/425 |
| 2023/0039356 | A1 | 2/2023 | Jee et al. | |
| 2023/0140094 | A1 | 5/2023 | Cha et al. | |
| 2023/0179007 | A1 | 6/2023 | Bae et al. | |
| 2023/0184843 | A1 | 6/2023 | Bae et al. | |
| 2023/0184844 | A1 | 6/2023 | Devie et al. | |
| 2023/0194620 | A1* | 6/2023 | Choi | H01M 10/42<br>702/63 |
| 2023/0194622 | A1* | 6/2023 | Kim | H02J 7/0047<br>324/434 |
| 2023/0280403 | A1 | 9/2023 | Jeong et al. | |
| 2023/0305065 | A1 | 9/2023 | Lim | |

FOREIGN PATENT DOCUMENTS

| | | | | |
|---|---|---|---|---|
| JP | 6364127 | B2 | 7/2018 | |
| JP | 2018-206612 | A | 12/2018 | |
| KR | 10-1572650 | B1 | 12/2015 | |
| KR | 10-2021-0033764 | A | 3/2021 | |
| KR | 10-2021-0070076 | A | 6/2021 | |
| KR | 10-2021-0141212 | A | 11/2021 | |
| KR | 10-2021-0141219 | A | 11/2021 | |
| KR | 10-2022-0033350 | A | 3/2022 | |
| KR | 10-2022-0045451 | A | 4/2022 | |
| KR | 10-2022-0056150 | A | 5/2022 | |
| KR | 10-2022-0107550 | A | 8/2022 | |
| KR | 10-2024-0000294 | A | 1/2024 | |
| WO | WO-2022035151 | A1 * | 2/2022 | G01R 19/10 |

OTHER PUBLICATIONS

Qi Zhang et al. (2023), "Lithium-ion battery calendar aging mechanism analysis and impedance-based State-of-Health estimation method," Elsevier, Journal of Energy Storage 64, 107029, Mar. 21, 2023, pp. 1-14.

* cited by examiner

FIG. 9

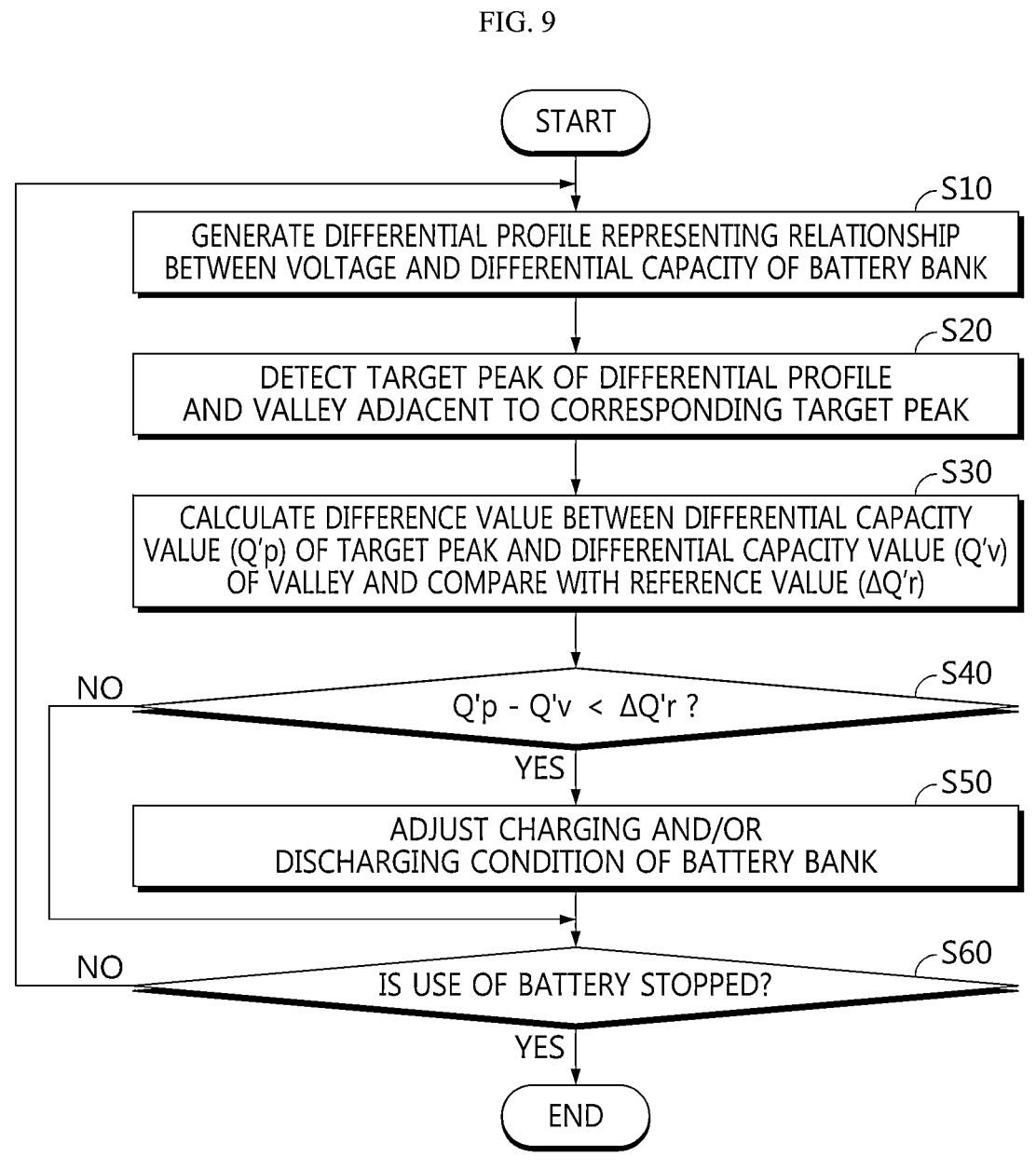

START

S10
GENERATE DIFFERENTIAL PROFILE REPRESENTING RELATIONSHIP BETWEEN VOLTAGE AND DIFFERENTIAL CAPACITY OF BATTERY BANK

S20
DETECT TARGET PEAK OF DIFFERENTIAL PROFILE AND VALLEY ADJACENT TO CORRESPONDING TARGET PEAK

S30
CALCULATE DIFFERENCE VALUE BETWEEN DIFFERENTIAL CAPACITY VALUE (Q'p) OF TARGET PEAK AND DIFFERENTIAL CAPACITY VALUE (Q'v) OF VALLEY AND COMPARE WITH REFERENCE VALUE (ΔQ'r)

S40
Q'p - Q'v < ΔQ'r ?

NO

YES

S50
ADJUST CHARGING AND/OR DISCHARGING CONDITION OF BATTERY BANK

S60
IS USE OF BATTERY STOPPED?

NO

YES

END

APPARATUS AND METHOD FOR DIAGNOSING A BATTERY ASSEMBLY

CROSS-REFERENCE TO RELATED APPLICATIONS

This application is based on and claims priority from Korean Patent Application No. 10-2024-0019805, filed on Feb. 8, 2024, with the Korean Intellectual Property Office, the disclosure of which is incorporated herein in its entirety by reference.

TECHNICAL FIELD

The present disclosure relates to an apparatus and method for diagnosing a battery assembly, and more particularly, to an apparatus and method for non-destructively diagnosing a state of a battery assembly capable of charging and discharging.

BACKGROUND

Recently, the demand for portable electronic products such as notebook computers, digital cameras and portable telephones has increased sharply, and electric vehicles, energy storage systems, robots, satellites and the like have been developed in earnest. Accordingly, high-performance batteries allowing charging and discharging and having a high energy density are being actively studied.

Types of rechargeable batteries include lithium batteries that use lithium ions, such as lithium-ion batteries or lithium-ion polymer batteries, and nickel cadmium batteries, nickel hydrogen batteries, and nickel zinc batteries. Among these, lithium batteries have the advantages of having a relatively long lifespan, a very low self-discharge rate, and high energy density because they have almost no memory effect compared to batteries that use nickel, and thus their application range is gradually expanding.

The positive electrode and negative electrode of these batteries gradually deteriorate as the charge and discharge cycles are repeated, and they no longer maintain the electrical capacity they had at the time of manufacture but are deteriorated. Therefore, in order to accurately predict the usable time, remaining life, and replacement time of the battery, an accurate diagnosis of the battery state is required.

However, in diagnosing the battery assembly (e.g., battery module or battery pack) that includes a plurality of battery cells corresponding to the basic units of charge and discharge, the existing technologies perform diagnosis based on the SOH (State of Health) of the corresponding battery assembly. As a result, when the battery assembly includes a plurality of battery banks that are provided by connecting a plurality of battery cells in parallel with each other, the existing technologies have a problem in that they cannot diagnose the state of the corresponding battery assembly for each battery bank, and cannot diagnose whether the battery cells of each battery bank are deteriorated unevenly.

SUMMARY

Embodiments of the present disclosure are designed to at least partly address and even solve the problems of the related art, and therefore embodiments of the present disclosure are directed to providing an apparatus and method for diagnosing a battery assembly including a plurality of battery banks, comprising a plurality of battery cells connected in parallel, for each battery bank, and may diagnose whether the battery cells of each battery bank are deteriorated unevenly.

Another technical challenge that embodiments of the present disclosure seek to address is to provide an apparatus and method for diagnosing a battery assembly that may extend the life of the battery assembly and improve safety.

A method for diagnosing a battery assembly according to one aspect of the present disclosure diagnoses a battery assembly including a battery comprising a plurality of battery cells connected in parallel with each other, and the method comprises generating a differential profile representing a relationship between a differential capacity, which is obtained by differentiating a capacity of the battery bank with respect to a voltage of the battery bank, and the voltage of the battery bank; and diagnosing a state of the battery bank based on a difference value between a differential capacity value of a target peak located in a predetermined voltage section among a plurality of peaks of the differential profile and a differential capacity value of a valley adjacent to the target peak.

In an embodiment, generating the differential profile may include repeatedly measuring a voltage value and a current value of the battery bank using at least one electrical sensor while the battery bank is being charged or discharged; and generating the differential profile using the voltage values and the current values measured while the battery bank is being charged or discharged.

In an embodiment, generating the differential profile may include generating a profile representing the relationship between the voltage and the capacity of the battery bank; and generating the differential profile by differentiating the profile with respect to the voltage of the battery bank.

In an embodiment, diagnosing the state of the battery bank may include diagnosing the state of the battery bank as an abnormal state when the difference value is less than a predetermined reference value.

In an embodiment, diagnosing the state of the battery bank may include diagnosing the state of the battery bank as an abnormal state in which the plurality of battery cells are unevenly deteriorated, when the difference value is less than a predetermined reference value and the number of target peaks located in the predetermined voltage section exceeds a predetermined reference number.

In an embodiment, diagnosing the state of the battery bank may include calculating a first difference value between a differential capacity value of a first target peak located in a first voltage section among the predetermined voltage sections and a differential capacity value of a first valley adjacent to the first target peak; calculating a second difference value between a differential capacity value of a second target peak located in a second voltage section among the predetermined voltage sections and a differential capacity value of a second valley adjacent to the second target peak; and determining the state of the battery bank as an abnormal state in which the plurality of battery cells are unevenly deteriorated, when the first difference value is less than a predetermined first reference value and the second difference value is less than a predetermined second reference value.

In an embodiment, the battery assembly may include a plurality of battery banks, generating the differential profile may include generating a plurality of differential profiles respectively corresponding to the plurality of battery banks, and diagnosing the state of the battery bank may include diagnosing a state of each of the plurality of battery banks as a normal state or an abnormal state based on the plurality of differential profiles.

In an embodiment, diagnosing the state of the battery bank may include diagnosing the state of the battery bank as an abnormal state when the difference value is less than a predetermined reference value, and the method for diagnosing a battery may further comprise controlling a charger that charges the battery bank to reduce a voltage at an end of charging of the battery bank or reduce a current rate of a current that charges the battery bank, when the state of the battery bank is diagnosed as an abnormal state.

An apparatus for diagnosing a battery assembly according to another aspect of the present disclosure diagnoses a battery assembly including a battery bank comprising a plurality of battery cells connected in parallel with each other, and the apparatus comprises a differential profile generating unit configured to generate a differential profile representing a relationship between a differential capacity, which is obtained by differentiating a capacity of the battery bank with respect to a voltage of the battery bank, and the voltage of the battery bank; and a diagnosing unit configured to diagnose a state of the battery bank based on a difference value between a differential capacity value of a target peak located in a predetermined voltage section among a plurality of peaks of the differential profile and a differential capacity value of a valley adjacent to the target peak.

In an embodiment, the diagnosing unit may be configured to diagnose the state of the battery bank as an abnormal state when the difference value is less than a predetermined reference value.

In an embodiment, the diagnosing unit may include a calculation module configured to calculate a first difference value between a differential capacity value of a first target peak located in a first voltage section among the predetermined voltage sections and a differential capacity value of a first valley adjacent to the first target peak and calculate a second difference value between a differential capacity value of a second target peak located in a second voltage section among the predetermined voltage sections and a differential capacity value of a second valley adjacent to the second target peak; and a determination module configured to determine the state of the battery bank as an abnormal state in which the plurality of battery cells are unevenly deteriorated, when the first difference value is less than a predetermined first reference value and the second difference value is less than a predetermined second reference value.

In an embodiment, the battery assembly may include a plurality of battery banks, the differential profile generating unit may be configured to generate a plurality of differential profiles respectively corresponding to the plurality of battery banks, and the diagnosing unit may be configured to diagnose a state of each of the plurality of battery banks as a normal state or an abnormal state based on the plurality of differential profiles.

In an embodiment, the diagnosing unit may be configured to diagnose the state of the battery bank as an abnormal state when the difference value is less than a predetermined reference value, and the apparatus for diagnosing a battery may further comprise a battery management unit configured to control a charger that charges the battery bank to reduce a voltage at an end of charging of the battery bank or reduce a current rate of a current that charges the battery bank, when the state of the battery bank is diagnosed as an abnormal state.

A battery pack according to still another aspect of the present disclosure may comprise the apparatus for diagnosing a battery as described above.

A vehicle according to still another aspect of the present disclosure may comprise the apparatus for diagnosing a battery as described above.

Embodiments of the present disclosure diagnose the state of the battery bank by using the differential profile, which represents the relationship between the differential capacity, which is obtained by differentiating the capacity of the battery bank with respect to the voltage of the battery bank, and the voltage of the battery bank, thereby enabling the diagnosis of the state of the battery assembly including a plurality of battery banks for each battery bank, and improving the accuracy and reliability of the diagnosis result.

In addition, embodiments of the present disclosure may accurately diagnose whether the battery cells are deteriorated unevenly in a battery bank comprising battery cells connected in parallel by diagnosing the state of the battery bank based on the difference value between the differential capacity value of a target peak located in a predetermined voltage section among a plurality of peaks of the differential profile and the differential capacity value of a valley adjacent to the target peak.

In addition, embodiments of the present disclosure may perform management of a battery assembly including a plurality of battery banks for each battery bank by controlling the charge and/or discharge conditions of the corresponding battery bank according to the diagnosis result of the battery bank, thereby extending the life of the entire battery assembly and improving safety.

Furthermore, a person having ordinary skill in the art to which the present disclosure belongs will be able to clearly understand from the following description that various embodiments according to the present disclosure can solve various technical problems not mentioned above.

DESCRIPTION OF DRAWINGS

FIG. 9 is a flow chart showing a method for diagnosing a battery according to an embodiment of the present disclosure.

DETAILED DESCRIPTION

Hereinafter, in order to clarify aspects of the solution corresponding to the technical challenge of the present disclosure, embodiments according to the present disclosure will be described in detail with reference to the attached drawings. However, when explaining the present disclosure, if a description of a related publicly known technology obscures the gist of the present disclosure, the description thereof may be omitted. In addition, the terms used in this specification are terms defined in consideration of the functions in the present disclosure, and these may vary depending on the intention or custom of the designer, manufacturer, etc. Therefore, the definitions of the terms described below should be made based on the contents throughout this specification.

Figure 1:
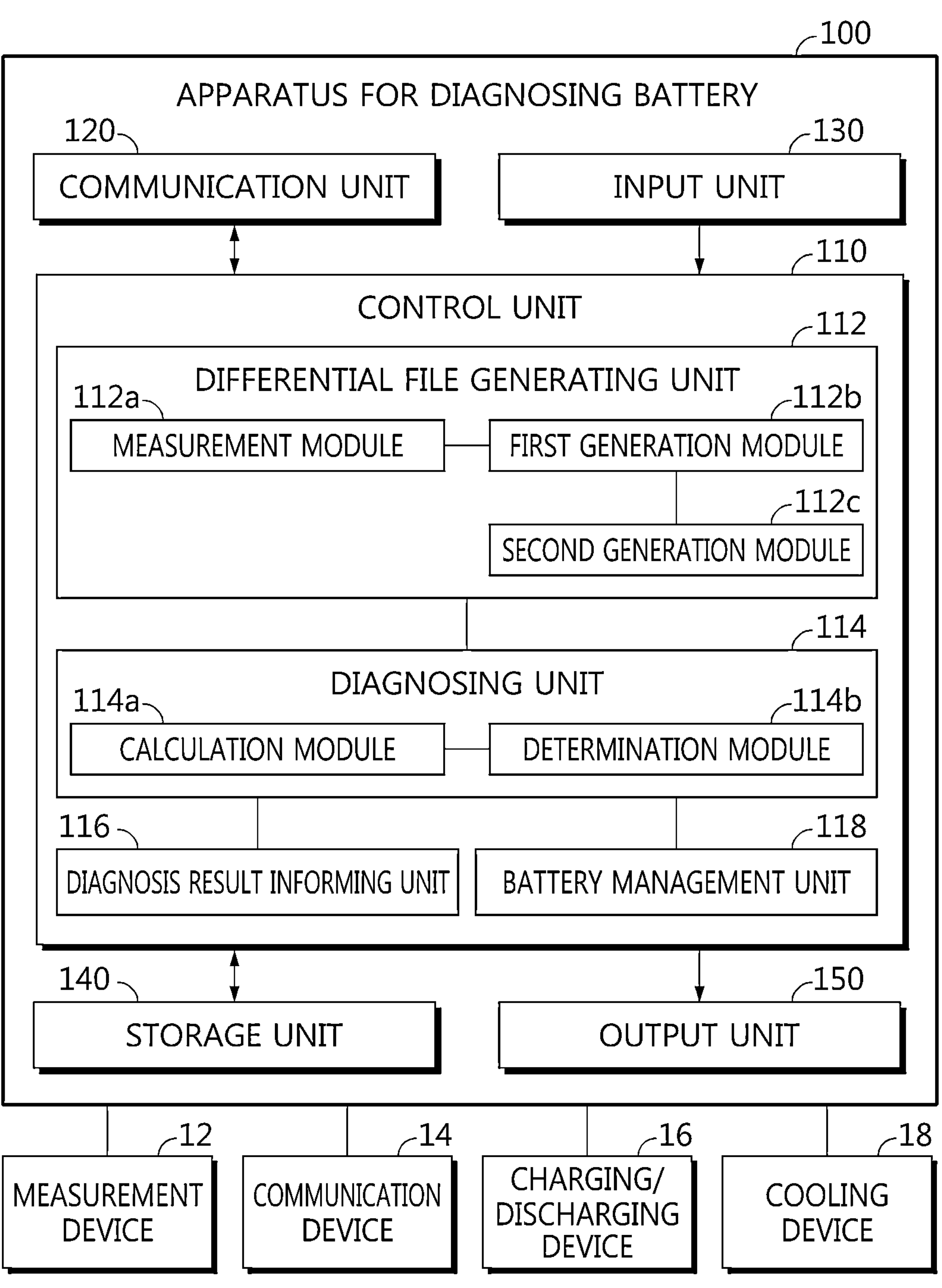
FIG. 1 is a block diagram showing an apparatus for diagnosing a battery according to an embodiment of the present disclosure.

FIG. 1 is a block diagram showing an apparatus 100 for diagnosing a battery assembly according to an embodiment of the present disclosure.

As illustrated in FIG. 1, the apparatus 100 for diagnosing a battery assembly according to an embodiment of the present disclosure includes a control unit 110. The control unit 110 is configured to non-destructively diagnose a battery assembly including one or more battery banks comprising a plurality of rechargeable battery cells connected in parallel.

To this end, the control unit 110 may include one or more general-purpose processors or ASICs (application-specific integrated circuits) for executing the battery diagnosis logic, and may optionally further include hardware such as registers and memories according to an embodiment. The control unit 110 may be configured with a combination of hardware such as a processor and software such as a computer program. That is, the battery diagnosis logic of the control unit 110 may be configured as a computer program and stored in the memory of the control unit 110 or a storage unit 140 described below, and the stored computer program may be configured to be executed through the hardware of the control unit 110.

Meanwhile, according to certain embodiments, the control unit 110 is a detailed component for diagnosing the battery assembly and includes a differential profile generating unit 112 and a diagnosing unit 114.

According to certain embodiments, the differential profile generating unit 112 is configured to generate a differential profile representing the corresponding relationship between the differential capacity, which is obtained by differentiating the capacity of a battery bank included in a battery assembly with respect to the voltage of the battery bank, and the voltage of the battery bank.

In an embodiment, the differential profile generating unit 112 may include a measurement module 112*a*, a first generation module 112*b*, and a second generation module 112*c*.

In this case, the measurement module 112*a* may be configured to repeatedly measure the voltage value and current value of the battery bank using at least one electrical sensor while the battery bank is being charged or discharged.

The first generation module 112*b* and the second generation module 112*c* may generate the differential profile using the voltage values and current values measured by the measurement module 112*a* while the battery bank is being charged or discharged.

For example, the first generation module 112*b* may be configured to generate a profile representing the corresponding relationship between the voltage and capacity of the battery bank using voltage values and current values measured while the battery bank is being charged or discharged.

The second generation module 112*c* may be configured to generate the differential profile by differentiating the generated profile with respect to the voltage of the battery bank.

According to certain embodiments, the diagnosing unit 114 is configured to diagnose the state of the battery bank based on a difference value between the differential capacity value of the target peak located in a predetermined voltage section among a plurality of peaks of the differential profile and the differential capacity value of a valley adjacent to the target peak.

The voltage section where the target peak is located may be experimentally determined. That is, the voltage section where the peak where splitting occurs due to uneven deterioration of the battery bank among the peaks of the differential profile is located may be experimentally confirmed, and the confirmed voltage section may be determined as the voltage section where the target peak is located.

In an embodiment, the diagnosing unit 114 may be configured to diagnose the state of the battery bank as an abnormal state if the difference value is less a predetermined reference value. In this case, the abnormal state may mean a state in which a plurality of battery cells forming the battery bank are unevenly deteriorated.

The reference value may be a differential capacity difference value between a target peak detected from the differential profile generated at the BOL (Beginning of Life) point of the battery bank and a neighboring valley, or a difference value determined during the design of the battery assembly.

In another embodiment, the diagnosing unit 114 may be configured to diagnose the state of the battery bank as an abnormal state if the difference value is less than a predetermined reference value and the number of target peaks located in the predetermined voltage section exceeds a predetermined reference number. In this case, the abnormal state may mean a state in which a plurality of battery cells forming the battery bank are unevenly deteriorated.

In an embodiment, the diagnosing unit 114 may include a calculation module 114*a* and a determination module 114*b*.

In this case, the calculation module 114*a* may be configured to calculate a difference value between a differential capacity value of a target peak located in the predetermined voltage section and a differential capacity value of a first valley adjacent to the target peak.

The determination module 114*b* may be configured to determine the state of the battery bank as an abnormal state in which a plurality of battery cells of the battery bank are unevenly deteriorated, if the difference value is less than a predetermined reference value.

In another embodiment, the diagnosing unit 114 may be configured to determine the state of the battery bank based on a plurality of target peaks.

In this case, the calculation module 114*a* may be configured to calculate a first difference value between a differential capacity value of a first target peak located in a first voltage section among the predetermined voltage sections and a differential capacity value of a first valley adjacent to the first target peak, and to calculate a second difference value between a differential capacity value of a second target peak located in a second voltage section among the predetermined voltage sections and a differential capacity value of a second valley adjacent to the second target peak.

The determination module 114*b* may be configured to determine the state of the battery bank as an abnormal state in which a plurality of battery cells of the battery bank are unevenly deteriorated, if the first difference value is less than a predetermined first reference value and the second difference value is less than a predetermined second reference value.

In an embodiment, when the battery assembly to be diagnosed includes a plurality of battery banks, the differential profile generating unit 112 may be configured to generate a plurality of differential profiles respectively corresponding to the plurality of battery banks.

In addition, the diagnosing unit 114 may be configured to diagnose the state of each of the plurality of battery banks as a normal state or an abnormal state based on the plurality of differential profiles.

In an embodiment, the control unit 110 may further include a diagnosis result informing unit 116. In this case, the diagnosis result informing unit 116 may be configured to output a visual, auditory or audio-visual notification signal corresponding to the diagnosis result of the battery bank using a predetermined output device.

In an embodiment, the control unit 110 may further include a battery management unit 118. In this case, the battery management unit 118 may be configured to control a charging condition and/or a discharging condition of the battery bank according to the diagnosis result of the diagnosing unit 114.

For example, according to the diagnosis result of the diagnosing unit 114, when an abnormal battery bank is detected among the plurality of battery banks included in the battery assembly, the battery management unit 118 may be configured to control a charger that charges the abnormal battery bank to reduce a voltage at the end of charging of the abnormal battery bank or reduce a current rate of a current that charges the abnormal battery bank.

Meanwhile, the battery management unit 118 may be configured to control the cooling device 18 described later to lower the temperature of an abnormal battery bank.

The differential profile generating unit 112, the diagnosing unit 114, the diagnosis result informing unit 116, and the battery management unit 118 of the above-described control unit 110 may be implemented as a combination of a processor and a program executed by the processor. In this case, the control unit 110 may be implemented as a single processor, or may be implemented as two or more processors that are interconnected.

In an embodiment, the apparatus 100 for diagnosing a battery may further include a communication unit 120. The communication unit 120 may be configured to receive data transmitted from a remotely located server or communication terminal via a wired and/or wireless communication network and transmit the data to the control unit 110, or transmit control signals, diagnostic data, etc. processed by the control unit 110 to the remotely located server or communication terminal. To this end, the communication unit 120 may include a communication modem that performs wired and/or wireless communication.

In an embodiment, the apparatus 100 for diagnosing a battery may further include an input unit 130. The input unit 130 may be configured to receive commands or data from a user or an administrator. For this purpose, the input unit 130 may include an input device such as a keyboard, operating buttons, or a touch panel.

In an embodiment, the apparatus 100 for diagnosing a battery may further include a storage unit 140. The storage unit 140 may be configured to store and manage data required for the operation of the apparatus 100 for diagnosing a battery. To this end, the storage unit 140 may include one or two or more of a ROM, a RAM, an EEPROM, a register, a flash memory, a CD-ROM, a magnetic tape, a hard disk, a floppy disk, and an optical data recording device.

In an embodiment, the apparatus 100 for diagnosing a battery may further include an output unit 150. The output unit 150 may be configured to visually, audibly or audiovisually output a notification signal of the diagnosis result informing unit 116. For this purpose, the output unit 150 may include a visual output device such as a light-emitting diode, a monitor, a display panel or a touch screen. In addition, the output unit 150 may further include a sound generating device such as a speaker.

In an embodiment, the apparatus 100 for diagnosing a battery may be configured to be interlocked with a measurement device 12 for measuring voltage and/or current of a battery assembly to be diagnosed, a communication device 14 for communicating with another device, a charging/discharging device 16 for charging and discharging battery banks included in the battery assembly, a cooling device 18 for cooling the battery banks included in the battery assembly, etc.

In another embodiment, the apparatus 100 for diagnosing a battery according to the present disclosure may include one or more of the measurement device 12, the communication device 14, the charging/discharging device 16, and the cooling device 18 described above.

Figure 2:
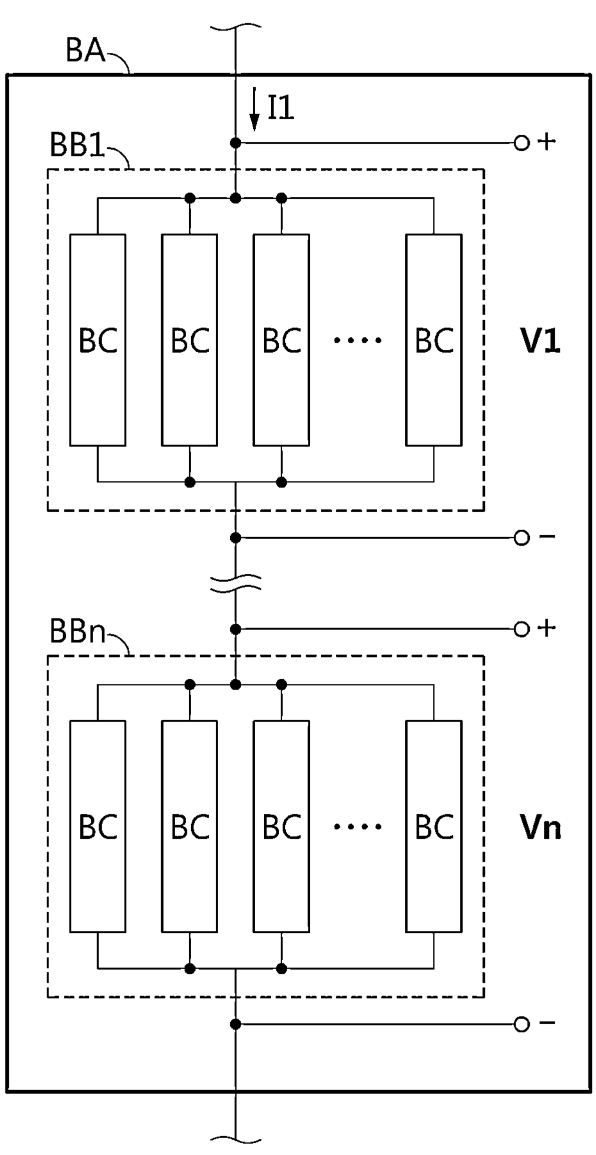
FIG. 2 is a drawing showing an example of a battery assembly to be diagnosed according to the present disclosure.

FIG. 2 is a drawing showing an example of a battery assembly BA to be diagnosed according to the present disclosure.

As illustrated in FIG. 2, the battery assembly BA, which is the diagnostic target of the present disclosure, may include a plurality of battery banks BB1 to BBn. In this case, the plurality of battery banks BB1 to BBn may be connected in series with each other, or may be connected in a manner that mixes series and parallel connections. In addition, each battery bank may include a plurality of battery cells BC that are connected in parallel with each other.

Such a battery assembly BA may be implemented as a battery module or a battery pack including battery banks and a case that accommodates the battery banks.

In this way, since the plurality of battery cells BC included in each battery bank are connected in parallel with each other, it can be difficult to measure the voltage of each battery cell. Therefore, the existing technology that estimates the SOC or SOH of the battery assembly by using the voltage, current, temperature, etc. of the entire battery assembly as parameters cannot diagnose the state of the battery assembly for each battery bank, and cannot determine whether the battery cells of the above-mentioned battery bank are deteriorated unevenly.

On the other hand, the apparatus 100 for diagnosing a battery according to embodiments of the present disclosure measures the voltage (V1) and current (I1) of the battery bank BB1 while the battery bank BB1 is being charged or discharged, generates a profile representing the corresponding relationship between the voltage and capacity of the battery bank BB1, and uses a differential profile obtained by differentiating this profile to diagnose the state of the battery bank, thereby making it possible to diagnose the state of the battery assembly for each battery bank and accurately determine whether the battery cells of the battery bank are deteriorated unevenly.

Figure 3:
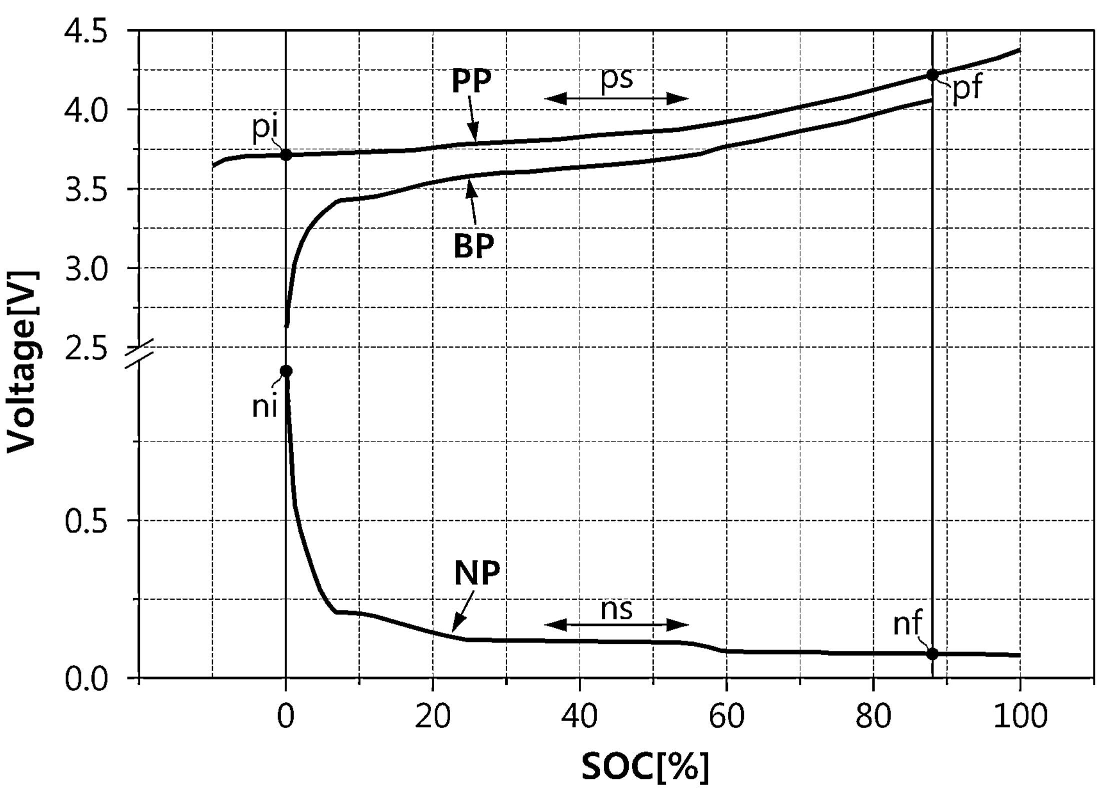
FIG. 3 is a drawing showing an example of a profile showing the corresponding relationship between the capacity and voltage of a battery bank.

FIG. 3 is a drawing showing an example of a profile showing the corresponding relationship between the capacity and voltage of a battery bank.

As illustrated in FIG. 3, the differential profile generating unit 112 may generate a profile BP representing a corresponding relationship between the capacity and voltage of the battery bank BB1 by measuring electrical values (V1, I1) of the battery bank BB1 while the battery bank BB1 of FIG. 2 is being charged or discharged. In this case, the capacity of the battery bank may be expressed as a SOC value. For reference, the capacity of the battery bank BB1 may be calculated by applying a current integration method to the current (I1) that charges the battery bank BB1.

Meanwhile, the differential profile generating unit 112 may find the positive electrode profile PP and the negative electrode profile NP which generate a curve similar to the profile BP by mutual combination, and provide the start point (pi) and the end point (pf) of the positive electrode profile PP, the shrinkage ratio (ps) of the positive electrode profile PP compared with the reference positive electrode profile, the start point (ni) and the end point (nf) of the negative electrode profile NP, the shrinkage ratio (ns) of the negative electrode profile NP compared with the reference negative electrode profile, etc., to the diagnosing unit 114. The diagnosing unit 114 may use the start point (pi), the end point (pf) and the shrinkage ratio (ps) of the positive electrode profile PP, and the start point (ni), the end point (nf) and the shrinkage ratio (ns) of the negative electrode profile NP as diagnostic factors indicating the state of the battery bank BB1.

In addition, the differential profile generating unit 112 may generate the differential profile by differentiating the profile BP with respect to the voltage of the battery.

Figure 4:
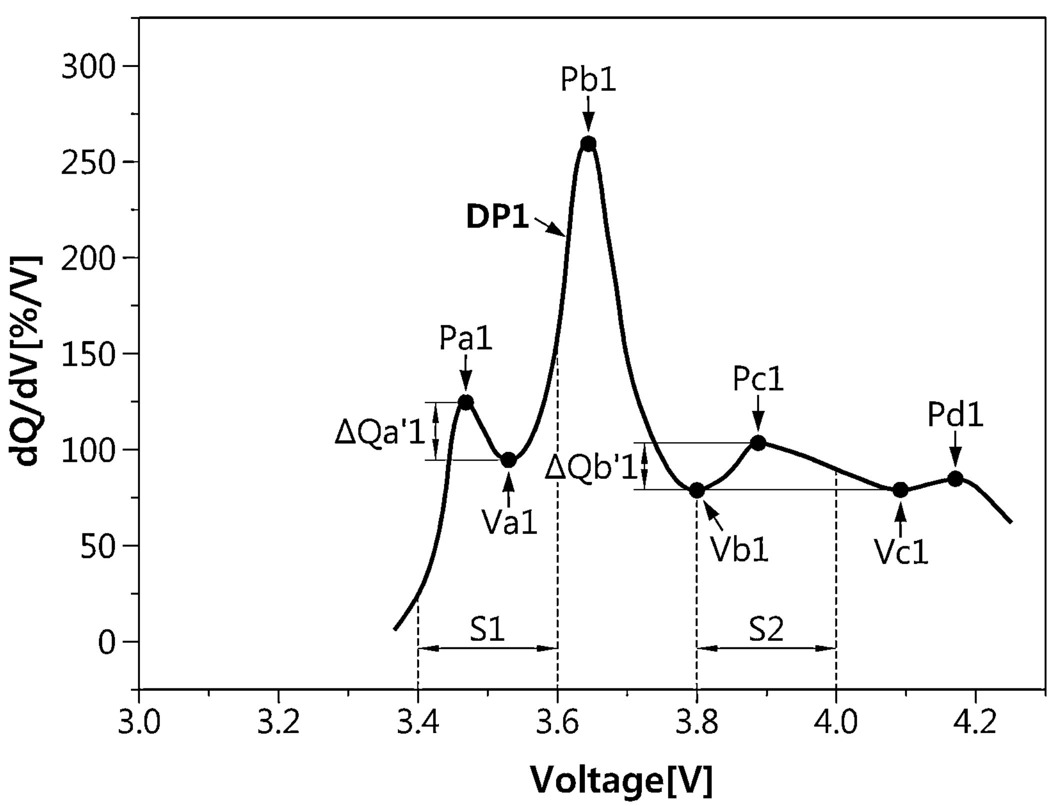
FIG. 4 is a drawing showing an example of a differential profile of a normal battery bank.

FIG. 4 is a drawing showing a differential profile DP1 of a normal battery bank.

As illustrated in FIG. 4, the differential profile generating unit 112 may generate, for each battery bank at a predetermined diagnostic cycle, a differential profile DP1 that represents a corresponding relationship between a differential capacity (dQ/dV), which is obtained by differentiating the capacity of the battery bank with respect to the voltage of the battery bank, and the voltage of the battery bank.

In this case, the measurement module 112*a* of the differential profile generating unit 112 may repeatedly measure the voltage value and current value of the battery bank using at least one electrical sensor while the battery bank is being charged or discharged.

Then, the first generation module 112*b* and the second generation module 112*c* of the differential profile generating unit 112 may generate the differential profile DP1 using the voltage values and current values measured by the measurement module 112*a* while the battery bank is being charged or discharged.

For example, the first generation module 112*b* may generate a profile BP representing a corresponding relationship between the voltage and capacity of the battery bank using the voltage values and current values measured while the battery bank is being charged or discharged.

Next, the second generation module 112*c* may generate the differential profile DP1 by differentiating the generated profile BP with respect to the voltage of the battery bank.

The diagnosing unit 114 may diagnose the state of the battery bank based on the difference value (ΔQa'1) between the differential capacity value of a target peak (Pa1) located in a predetermined voltage section (S1) among a plurality of peaks (Pa1, Pb1, Pc1, Pd1) of the differential profile DP1 and the differential capacity value of a valley (Va1) adjacent to the target peak (Pa1). The voltage section (S1) may be a section from 3.4 [V] to 3.6 [V].

For example, if the difference value (ΔQa'1) is less than a predetermined reference value, the diagnosing unit 114 may be configured to diagnose the state of the battery bank as an abnormal state. In this case, the abnormal state may mean a state in which a plurality of battery cells forming the battery bank are unevenly deteriorated.

The reference value may be a differential capacity difference value between a target peak and a neighboring valley detected from a differential profile generated at the BOL (Beginning of Life) point of the battery bank, or a difference value determined during the design of the battery assembly.

In another embodiment, the diagnosing unit 114 may be configured to determine the state of the battery bank based on a plurality of target peaks.

In this case, the calculation module 114*a* of the diagnosing unit 114 may be configured to calculate a first difference value (ΔQa'1) between a differential capacity value of a first target peak (Pa1) located in a first voltage section (S1) of the predetermined voltage section and a differential capacity value of a first valley (Va1) adjacent to the first target peak (Pa1), and to calculate a second difference value (ΔQb'1) between a differential capacity value of a second target peak (Pc1) located in a second voltage section (S2) of the predetermined voltage section and a differential capacity value of a second valley (Vb1) adjacent to the second target peak (Pc1). The first voltage section (S1) may be a section from 3.4 [V] to 3.6 [V], and the second voltage section (S2) may be a section from 3.8 [V] to 4.0 [V].

Then, the determination module 114*b* of the diagnosing unit 114 may determine the state of the battery bank as an abnormal state in which a plurality of battery cells of the battery bank are unevenly deteriorated, if the first difference value (ΔQa'1) is less than a predetermined first reference value and the second difference value (ΔQb'1) is less than a predetermined second reference value.

For reference, the differential profile DP1 may provide various diagnostic factors. For example, the voltage value of the first peak (Pa1) among the plurality of peaks (Pa1, Pb1, Pc1, Pd1) of the differential profile DP1 may be used as a factor for diagnosing the available lithium loss of the corresponding battery bank. In addition, the differential capacity value of the second peak (Pb1) may be used as a factor for diagnosing the positive electrode deterioration state of the corresponding battery bank. In addition, the voltage value of the second peak (Pb1) and the voltage value of the second valley (Vb1) may be used as auxiliary factors for diagnosing the positive electrode deterioration state or the available lithium loss rate.

Figure 5:
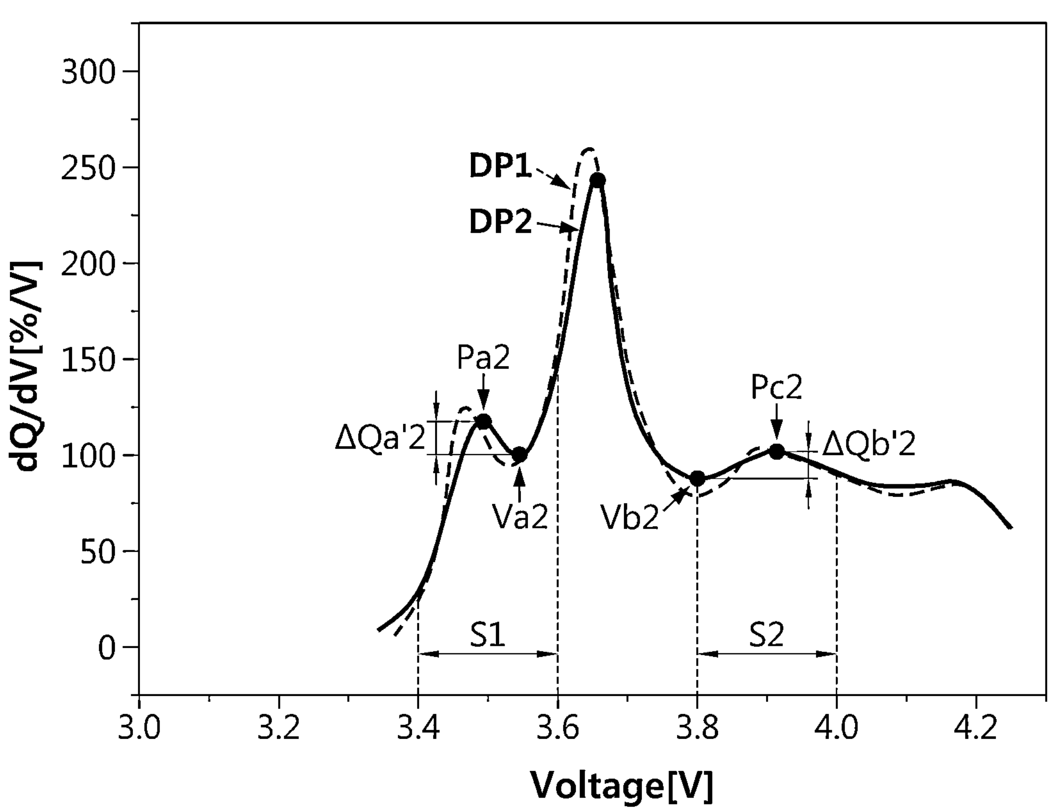
FIG. 5 is a drawing showing an example of the differential profile of a battery bank that is being deteriorated unevenly.

FIG. 5 is a drawing showing the differential profile DP2 of a battery bank where uneven deterioration begins.

As shown in FIG. 5, in the differential profile DP2 of the battery bank where uneven deterioration begins, the difference value (ΔQa'2) between the differential capacity value of the first target peak (Pa2) and the differential capacity value of the first valley (Va2) is reduced compared to the differential profile DP1 shown in FIG. 4.

Similarly, in the differential profile DP2, the difference value (ΔQb'2) between the differential capacity value of the second target peak (Pc2) and the differential capacity value of the second valley (Vb2) is reduced compared to the differential profile DP1 illustrated in FIG. 4.

Figure 6:
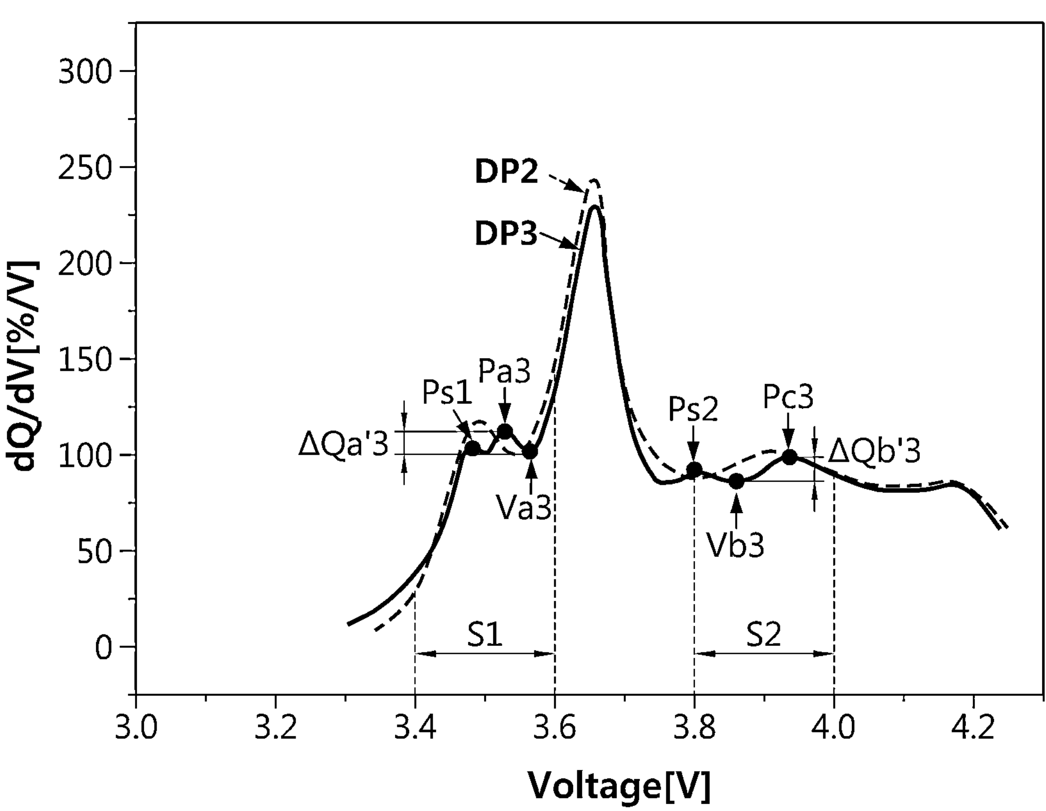
FIG. 6 is a drawing showing an example of a differential profile of an abnormal battery bank.

FIG. 6 is a drawing showing a differential profile DP3 of an abnormal battery bank.

As shown in FIG. 6, in the differential profile DP3 of an abnormal battery bank in which battery cells are unevenly deteriorated, the first difference value (ΔQa'3) between the differential capacity value of the first target peak (Pa3) and the differential capacity value of the first valley (Va3) is reduced compared to the differential profile DP2 shown in FIG. 5.

Similarly, in the differential profile DP3, the second difference value (ΔQb'3) between the differential capacity value of the second target peak (Pc3) and the differential capacity value of the second valley (Vb3) is reduced compared to the differential profile DP2 illustrated in FIG. 5.

The determination module 114*b* may determine the state of the battery bank as an abnormal state if the first difference value (ΔQa'3) is less than a predetermined first reference value and the second difference value (ΔQb'3) is less than a predetermined second reference value. In this case, the abnormal state may mean a state in which a plurality of battery cells forming the battery bank are unevenly deteriorated.

In particular, additional peaks (Ps1, Ps2) may occur around the first target peak (Pa3) and the second target peak (Pc3) of the differential profile DP3 generated after use of the battery assembly due to peak splitting phenomenon caused by uneven deterioration of the battery bank.

Accordingly, the diagnosing unit 114 may be configured to diagnose the state of the battery bank as an abnormal state if the first difference value (ΔQa'3) is less than a predetermined first reference value, the second difference value (ΔQb'3) is less than a predetermined reference value, and the number of target peaks located in the predetermined voltage section (S1, S2) exceeds a predetermined reference number. In this case, the abnormal state may mean a state in which a plurality of battery cells forming the battery bank are unevenly deteriorated.

Figure 7:
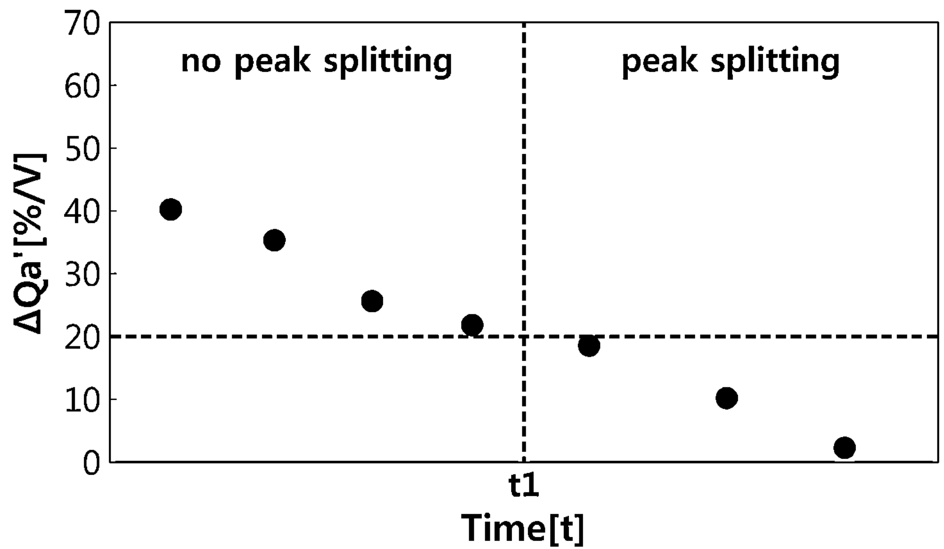
FIG. 7 is a graph showing the trend of a differential capacity difference value between a first target peak and a first valley, as shown in FIG. 4, changing over time.

FIG. 7 is a graph showing the trend of a differential capacity difference value between a first target peak (Pa1) and a first valley (Va1), as shown in FIG. 4, changing over time.

As shown in FIG. 7, if the battery cells of the battery bank are deteriorated unevenly, the differential capacity difference value (ΔQa') between the first target peak (Pa1) and the first valley (Va1) located in the first voltage section (S1) of the differential profile DP1 decreases over time.

In addition, if it reaches a point (t1) at which the difference value (ΔQa') becomes smaller than the first reference value (e.g., 20 [%/V]), a peak splitting phenomenon occurs in the first target peak (Pa1).

Figure 8:
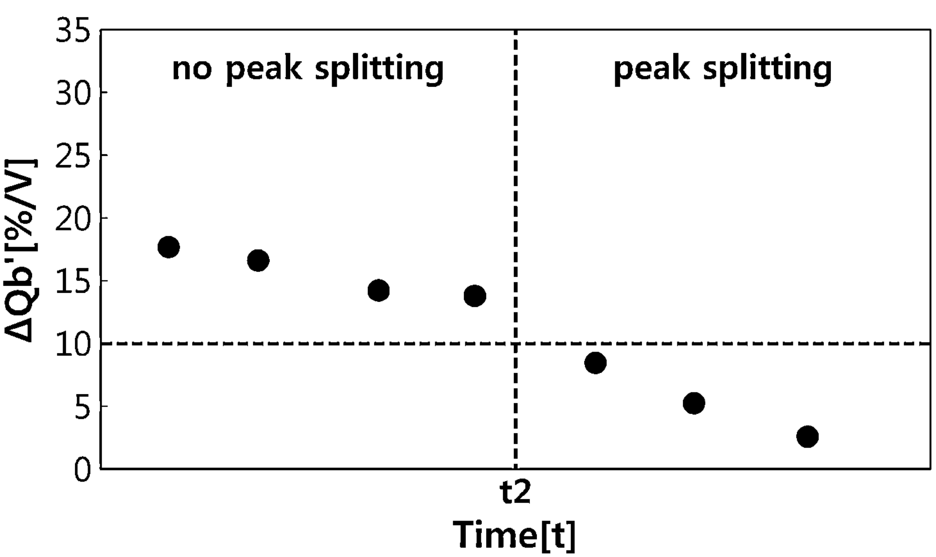
FIG. 8 is a graph showing the trend of a differential capacity difference value between a second target peak and a second valley, as shown in FIG. 4, changing over time.

FIG. 8 is a graph showing the trend of a differential capacity difference value between a second target peak (Pc1) and a second valley (Vb1), as shown in FIG. 4, changing over time.

As illustrated in FIG. 8, if the battery cells of the battery bank are deteriorated unevenly, the differential capacity difference value (ΔQb') between the second target peak (Pc1) and the second valley (Vb1) located in the second voltage section (S2) of the differential profile DP1 decreases over time.

In addition, if it reaches a point (t2) at which the difference value (ΔQb') becomes smaller than the second reference value (e.g., 10 [%/V]), a peak splitting phenomenon occurs in the second target peak (Pc1).

FIG. 9 is a flow chart showing a method for diagnosing a battery according to an embodiment of the present disclosure.

As illustrated in FIG. 9, the method for diagnosing a battery according to embodiments of the present disclosure is a method for non-destructively diagnosing a battery assembly including a battery bank comprising a plurality of battery cells connected in parallel with each other, and may be performed by a processor.

First, according to certain embodiments, the processor generates a differential profile representing the relationship between a differential capacity, which is obtained by differentiating the capacity of the battery bank included in the battery assembly with respect to the voltage of the battery bank, and the voltage of the battery bank (S10).

In this case, the processor may repeatedly measure the voltage value and current value of the battery bank using at least one electrical sensor while the battery bank is being charged or discharged.

Then, according to certain embodiments, the processor may generate a profile representing the corresponding relationship between voltage and capacity of the battery bank using the voltage values and current values measured while the battery bank is being charged or discharged.

Then, according to certain embodiments, the processor may generate the differential profile by differentiating the generated profile with respect to the voltage of the battery bank.

Next, according to certain embodiments, the processor may detect a target peak located in a predetermined voltage section among a plurality of peaks of the differential profile and a valley adjacent to the target peak (S20). The voltage section where the target peak is located may be experimentally determined. That is, the voltage section in which the peak where splitting occurs due to uneven deterioration of the battery bank among the peaks of the differential profile is located may be experimentally confirmed, and the confirmed voltage section may be determined as the voltage section where the target peak is located.

Next, the processor diagnoses the state of the battery bank based on the difference value (Q'p-Q'v) between the differential capacity value (Q'p) of the target peak and the differential capacity value (Q'v) of the neighboring valley (S30).

By comparing the difference value (Q'p-Q'v) with a predetermined reference value (ΔQ'r), if the difference value (Q'p-Q'v) is smaller than the reference value (ΔQ'r), the processor may diagnose the state of the battery bank as an abnormal state (S40). The abnormal state may mean a state in which a plurality of battery cells forming the battery bank are unevenly deteriorated.

For reference, the reference value (ΔQ'r) may be a differential capacity difference value between a target peak and a neighboring valley detected from a differential profile generated at the BOL (Beginning of Life) point of the corresponding battery bank, or a difference value determined during the design of the battery assembly.

In an embodiment, the processor may be configured to diagnose the state of the battery bank as an abnormal state if the difference value (Q'p-Q'v) is less than a predetermined reference value (ΔQ'r) and the number of target peaks located in the predetermined voltage section exceeds a predetermined number. In this case, the abnormal state may mean a state in which a plurality of battery cells forming the battery bank are unevenly deteriorated.

In another embodiment, the processor may determine the state of the battery bank based on a plurality of target peaks.

In this case, the processor may calculate a first difference value between a differential capacity value of a first target peak located in a first voltage section among the predetermined voltage sections and a differential capacity value of a first valley adjacent to the first target peak, and calculate a second difference value between a differential capacity value of a second target peak located in a second voltage section among the predetermined voltage sections and a differential capacity value of a second valley adjacent to the second target peak.

And, the processor may determine the state of the battery bank as an abnormal state in which a plurality of battery cells of the battery bank are unevenly deteriorated, if the first difference value is less than a predetermined first reference value and the second difference value is less than a predetermined second reference value.

In an embodiment, when the battery assembly to be diagnosed includes a plurality of battery banks, the processor may be configured to generate a plurality of differential profiles respectively corresponding to the plurality of battery banks.

In addition, the processor may be configured to diagnose the state of each of the plurality of battery banks as a normal state or an abnormal state based on the plurality of differential profiles.

Then, the processor may adjust the charging condition and/or discharging condition of the battery bank according to the diagnosis result of the battery bank (S50).

For example, when an abnormal battery bank diagnosed as an abnormal state is detected among the plurality of battery banks included in the battery assembly, the processor may be configured to control a charger that charges the abnormal battery bank to reduce a voltage at the end of charging of the abnormal battery bank or reduce a current rate of a current that charges the abnormal battery bank.

Also, the processor may be configured to control the cooling device 18 described later to lower the temperature of the abnormal battery bank.

Meanwhile, the processor may output a visual, auditory or audio-visual notification signal corresponding to the diagnosis result of the battery bank using a predetermined output device.

Then, the processor may repeat the steps described above (S10 to S50) until the battery assembly is no longer in use (S60).

Figure 10:
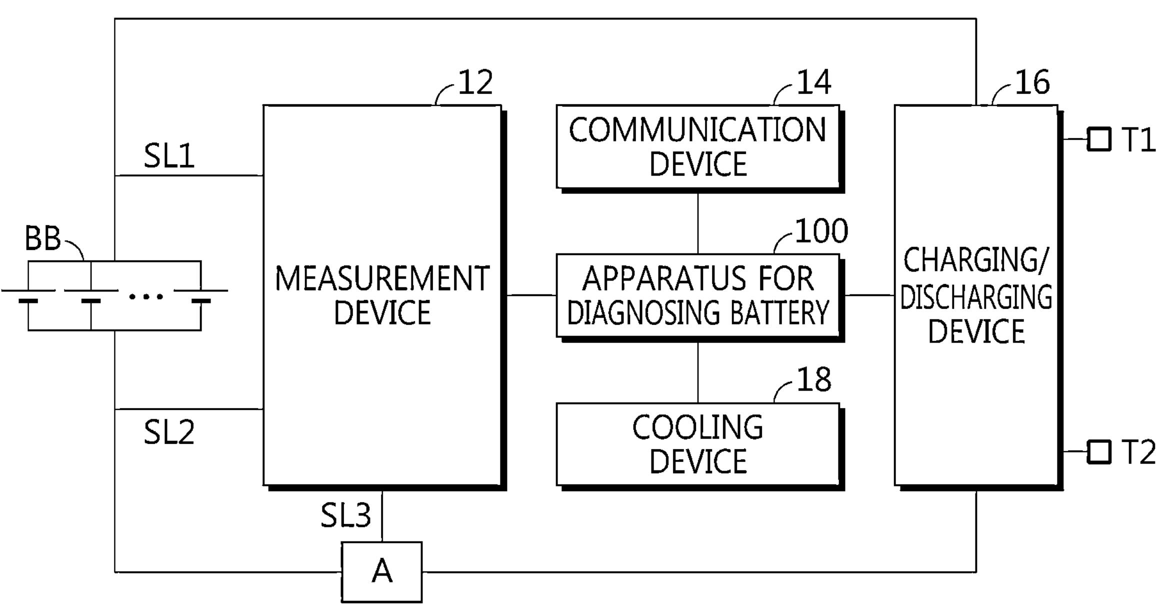
FIG. 10 is a drawing showing a battery pack according to an embodiment of the present disclosure.

FIG. 10 is a drawing showing a battery pack 10 according to an embodiment of the present disclosure.

As illustrated in FIG. 10, the battery pack 10 includes a battery bank BB comprising a plurality of battery cells connected in parallel with each other, and the apparatus 100 for diagnosing a battery assembly according to embodiments of the present disclosure. In an embodiment, the battery pack 10 may optionally further include a measurement device 12, a communication device 14, a charging/discharging device 16, and a cooling device 18.

The measurement device 12 may be configured to measure the voltage and/or current of the battery bank BB. To this end, the measurement device 12 may include at least one voltage sensor for sensing the voltage of the battery bank BB and/or at least one current sensor for sensing the current of the battery bank BB.

The measurement device 12 may measure the voltage of the battery bank BB through the first sensing line SL1 and the second sensing line SL2. In addition, the measurement device 12 may measure the current of the battery bank BB through the third sensing line SL3 connected to the current measurement circuit A. The current measurement circuit A may include a shunt resistor.

The apparatus 100 for diagnosing a battery according to an embodiment of the present disclosure may obtain voltage values of the battery bank BB through the measurement device 12. For reference, the capacity of the battery bank BB may be calculated by applying the current integration method.

The communication device 14 may be configured to perform communication with another device located remotely. For example, the communication device 14 may be configured to receive data transmitted from a remote server or communication terminal through a wired and/or wireless communication network and transmit the data to the apparatus 100 for diagnosing a battery, or transmit data generated in the apparatus 100 for diagnosing a battery to another server or communication terminal. To this end, the communication device 14 may include a communication modem that performs wired communication and/or wireless communication.

The charging/discharging device 16 may be configured to charge and/or discharge the battery bank BB. To this end, the charging/discharging device 16 may include a charger for charging the battery bank BB, a discharger for discharging the battery bank BB, at least one switch for electrically connecting the battery bank BB to terminals T1, T2 of the battery pack 10, etc.

The apparatus 100 for diagnosing a battery assembly according to an embodiment of the present disclosure may control the charging/discharging device 16 to perform or stop charging or discharging of the battery bank BB, set charging/discharging conditions, or change the set charging/discharging conditions.

The cooling device 18 may be configured to cool the battery bank BB. To this end, the cooling device 18 may include a heat sink that absorbs heat from the battery bank BB and releases it to the outside.

Figure 11:
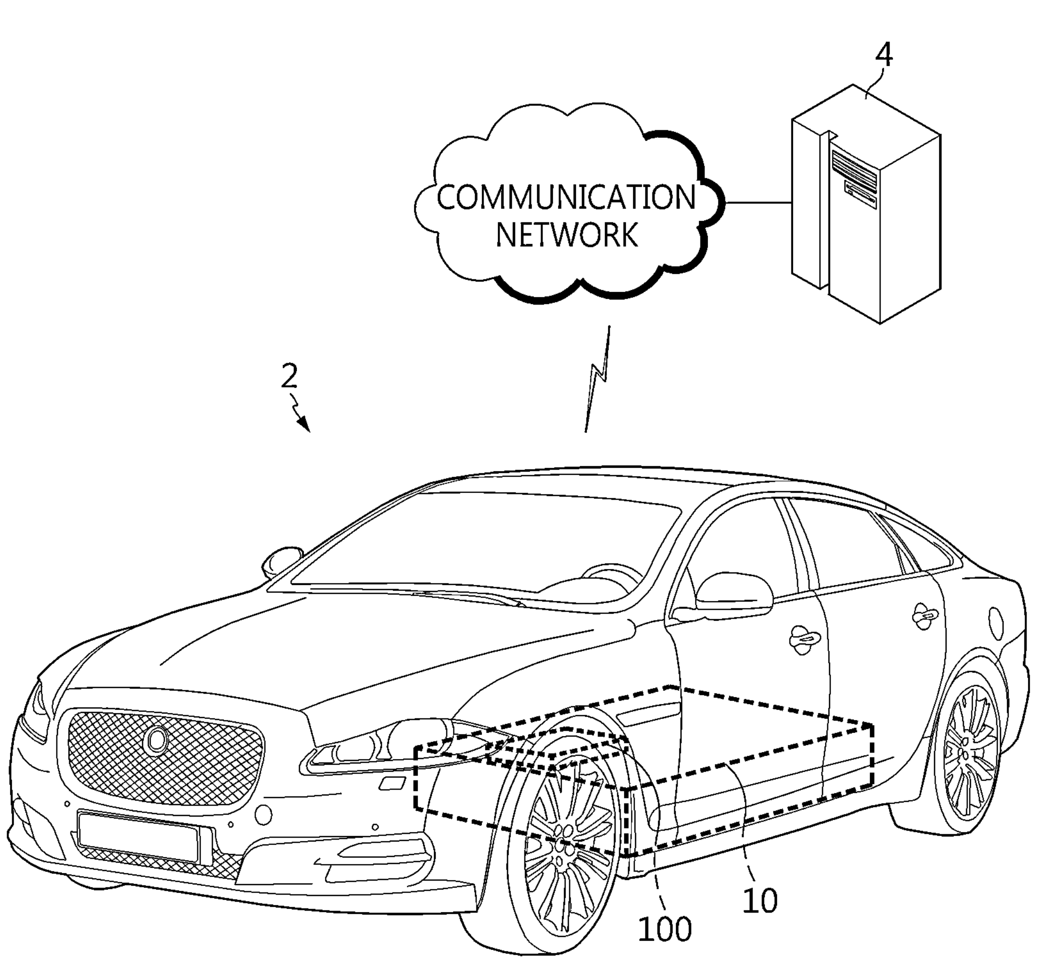
FIG. 11 is a drawing showing a vehicle according to an embodiment of the present disclosure.

FIG. 11 is a drawing showing a vehicle according to an embodiment of the present disclosure.

As illustrated in FIG. 11, the vehicle 2 according to an embodiment of the present disclosure may include a battery pack 10 that provides electrical energy necessary for the operation of the vehicle and the apparatus 100 for diagnosing a battery assembly according to the present disclosure.

In this case, the apparatus 100 for diagnosing a battery assembly may be configured to interact with an ECU (Electronic Control Unit) that controls the operation of the vehicle 2 or a BMS (Battery Management System) of the battery pack 10.

Additionally, the apparatus 100 for diagnosing a battery assembly may be configured to receive data transmitted from a remote server 4 via a wired and/or wireless communication network, or to transmit data generated by the apparatus 100 for diagnosing a battery assembly to the server 4.

For reference, the apparatus 100 for diagnosing a battery assembly according to the present disclosure may be applied to various electrical devices or electrical systems other than vehicles, as well as to ESS (Energy Storage System).

As described above, embodiments of the present disclosure diagnoses the state of the battery bank by using the differential profile, which represents the corresponding relationship between the differential capacity, which is obtained by differentiating the capacity of the battery bank with respect to the voltage of the battery bank, and the voltage of the battery bank, thereby enabling the diagnosis of the state of the battery assembly including a plurality of battery banks for each battery bank, and improving the accuracy and reliability of the diagnosis result.

In addition, embodiments of the present disclosure may accurately diagnose whether the battery cells are deteriorated unevenly in a battery bank comprising the battery cells connected in parallel by diagnosing the state of the battery bank based on the difference value between the differential capacity value of a target peak located in a predetermined voltage section among a plurality of peaks of the differential profile and the differential capacity value of a valley adjacent to the target peak.

In addition, embodiments of the present disclosure may perform management of a battery assembly including a plurality of battery banks for each battery bank by controlling the charge and/or discharge conditions of the corresponding battery bank according to the diagnosis result of the battery bank, thereby extending the life of the entire battery assembly and improving safety.

Furthermore, the embodiments according to the present disclosure may solve various technical problems other than those mentioned in this specification in the corresponding technical field as well as in related technical fields.

The present disclosure has been described with reference to specific embodiments. However, those skilled in the art will clearly understand that various modified embodiments can be implemented within the technical scope of the present disclosure. Therefore, the embodiments disclosed above should be considered from an illustrative rather than a restrictive perspective. In other words, the true technical scope of the present disclosure is indicated by the claims, and all differences within the scope equivalent thereto should be interpreted as being included in the present disclosure.

EXPLANATION OF REFERENCE SIGNS

2: vehicle
10: battery pack
100: apparatus for diagnosing a battery assembly
110: control unit
112: differential profile generating unit
114: diagnosing unit
116: diagnosis result informing unit
118: battery management unit
120: communication unit
130: input unit
140: storage unit
150: output unit

What is claimed is:

1. A method for diagnosing a battery assembly, the battery assembly including a battery bank comprising a plurality of battery cells connected in parallel with each other, the method comprising:

generating a differential profile representing a relationship between a differential capacity, which is obtained by differentiating a capacity of the battery bank with respect to a voltage of the battery bank, and the voltage of the battery bank;

diagnosing a state of the battery bank based on a difference value between a differential capacity value of a target peak located in a predetermined voltage section among a plurality of peaks of the differential profile and a differential capacity value of a downward peak adjacent to the target peak; and when the state of the battery bank is diagnosed as an abnormal state, controlling at least one of (i) a charger that charges the battery bank to reduce a voltage at an end of charging of the battery bank or reduce a current rate of a current that charges the battery bank, and (ii) a cooling device that cools the battery bank to lower the temperature of the battery bank.

2. The method for diagnosing the battery assembly according to claim 1, wherein generating the differential profile includes:

repeatedly measuring a voltage value and a current value of the battery bank using at least one electrical sensor while the battery bank is being charged or discharged; and generating the differential profile using the voltage values and the current values measured while the battery bank is being charged or discharged.

3. The method for diagnosing the battery assembly according to claim 1, wherein generating the differential profile includes;

generating a profile representing the relationship between the voltage and the capacity of the battery bank; and generating the differential profile by differentiating the profile with respect to the voltage of the battery bank.

4. The method for diagnosing the battery assembly according to claim 1, wherein diagnosing the state of the battery bank includes diagnosing the state of the battery bank as the abnormal state when the difference value is less than a predetermined reference value.

5. The method for diagnosing the battery assembly according to claim 1, wherein diagnosing the state of the battery bank includes diagnosing the state of the battery bank as the abnormal state in which the plurality of battery cells are unevenly deteriorated, when the difference value is less than a predetermined reference value and the number of target peaks located in the predetermined voltage section exceeds a predetermined reference number.

6. The method for diagnosing the battery assembly according to claim 1, wherein diagnosing the state of the battery bank includes:

calculating a first difference value between a differential capacity value of a first target peak located in a first voltage section among the predetermined voltage sections and a differential capacity value of a first downward peak adjacent to the first target peak;

calculating a second difference value between a differential capacity value of a second target peak located in a second voltage section among the predetermined voltage sections and a differential capacity value of a second downward peak adjacent to the second target peak; and determining the state of the battery bank as the abnormal state in which the plurality of battery cells are unevenly deteriorated, when the first difference value is less than a predetermined first reference value and the second difference value is less than a predetermined second reference value.

7. The method for diagnosing the battery assembly according to claim 1, wherein the battery assembly includes a plurality of battery banks, wherein generating the differential profile includes generating a plurality of differential profiles respectively corresponding to the plurality of battery banks, and wherein diagnosing the state of the battery bank includes a step of diagnosing a state of each of the plurality of battery banks as a normal state or the abnormal state based on the plurality of differential profiles.

8. The method for diagnosing the battery assembly according to claim 1, wherein diagnosing the state of the battery bank includes diagnosing the state of the battery bank as the abnormal state when the difference value is less than a predetermined reference value, and wherein the method for diagnosing the battery assembly further comprises controlling the charger that charges the battery bank to reduce the voltage at an end of charging of the battery bank or reduce the current rate of a current that charges the battery bank, when the state of the battery bank is diagnosed as the abnormal state.

9. An apparatus for diagnosing a battery assembly including a battery bank comprising a plurality of battery cells connected in parallel with each other, the apparatus comprising:

one or more processors; and memory configured to store program code that, when executed by the one or more processors, cause the one or more processors to perform:

generating a differential profile representing a relationship between a differential capacity, which is obtained by differentiating a capacity of the battery bank with respect to a voltage of the battery bank, and the voltage of the battery bank;

diagnosing a state of the battery bank based on a difference value between a differential capacity value of a target peak located in a predetermined voltage section among a plurality of peaks of the differential profile and a differential capacity value of a downward peak adjacent to the target peak; and when the state of the battery bank is diagnosed as an abnormal state, controlling at least one of (i) a charger that charges the battery bank to reduce a voltage at an end of charging of the battery bank or reduce a current rate of a current that charges the battery bank, and (ii) a cooling device that cools the battery bank to lower the temperature of the battery bank.

10. The apparatus for diagnosing the battery assembly according to claim 9, wherein execution of the program code by the one or more processors causes the one or more processors to perform diagnosing of the state of the battery bank as the abnormal state when the difference value is less than a predetermined reference value.

11. The apparatus for diagnosing the battery assembly according to claim 9, wherein execution of the program code by the one or more processors causes the one or more processors to perform:

calculating a first difference value between a differential capacity value of a first target peak located in a first voltage section among the predetermined voltage sections and a differential capacity value of a first downward peak adjacent to the first target peak, and calculating a second difference value between a differential capacity value of a second target peak located in a second voltage section among the predetermined voltage sections and a differential capacity value of a second downward peak adjacent to the second target peak; and determining the state of the battery bank as the abnormal state in which the plurality of battery cells are unevenly deteriorated, when the first difference value is less than a predetermined first reference value and the second difference value is less than a predetermined second reference value.

12. The apparatus for diagnosing the battery assembly according to claim 9, wherein the battery assembly includes a plurality of battery banks, and wherein execution of the program code by the one or more processors causes the one or more processors to perform:

generating a plurality of differential profiles respectively corresponding to the plurality of battery banks, and diagnosing a state of each of the plurality of battery banks as a normal state or the abnormal state based on the plurality of differential profiles.

13. The apparatus for diagnosing the battery assembly according to claim 9, wherein execution of the program code by the one or more processors causes the one or more processors to perform:

diagnosing the state of the battery bank as the abnormal state when the difference value is less than a predetermined reference value, and controlling the charger that charges the battery bank to reduce the voltage at end of charging of the battery bank or reduce the current rate of the current that charges the battery bank, when the state of the battery bank is diagnosed as the abnormal state.

14. A battery pack comprising the apparatus for diagnosing the battery assembly according to claim 9.

15. A vehicle comprising the apparatus for diagnosing the battery assembly according to claim 9.

* * * * *